(12) United States Patent
Nishiyama et al.

(10) Patent No.: US 7,804,221 B2
(45) Date of Patent: Sep. 28, 2010

(54) SURFACE ACOUSTIC WAVE DEVICE

(75) Inventors: Kenji Nishiyama, Yasu (JP); Takeshi Nakao, Omihachiman (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 130 days.

(21) Appl. No.: 12/332,394

(22) Filed: Dec. 11, 2008

(65) Prior Publication Data

US 2009/0085429 A1 Apr. 2, 2009

Related U.S. Application Data

(63) Continuation of application No. PCT/JP2007/060413, filed on May 22, 2007.

(30) Foreign Application Priority Data

Jun. 16, 2006 (JP) ............................. 2006-167303

(51) Int. Cl.
*H01L 41/08* (2006.01)

(52) U.S. Cl. .............................. 310/313 B; 310/313 A; 310/313 R (58) Field of Classification Search ............. 310/313 A, 310/313 R, 313 D, 313 B
See application file for complete search history.

(56) References Cited

U.S. PATENT DOCUMENTS

| 5,432,392 | A | 7/1995 | Kadota et al. |
| 2001/0013739 | A1 | 8/2001 | Yoshida et al. |
| 2006/0071579 | A1 | 4/2006 | Kando |
| 2006/0131992 | A1 | 6/2006 | Nakao et al. |
| 2007/0096592 | A1 | 5/2007 | Kadota et al. |

FOREIGN PATENT DOCUMENTS

| WO | 2005/011117 A1 | 3/2005 |
| WO | 2005/034347 A1 | 4/2005 |
| WO | 2005/036743 A1 | 4/2005 |

OTHER PUBLICATIONS

Official Communication issued in corresponding German Patent Application No. 11 2007 001 426, mailed on Feb. 4, 2010.
Official Communication issued in International Patent Application No. PCT/JP2007/060413, mailed on Aug. 21, 2007.

*Primary Examiner*—Mark Budd
(74) *Attorney, Agent, or Firm*—Keating & Bennett, LLP

(57) ABSTRACT

A surface acoustic wave device has high power withstanding performance and is able to effectively suppress an undesirable spurious response. The surface acoustic wave device includes an $LiNbO_3$ substrate having Euler angles ($0°\pm5°$, $\theta\pm5°$, $0°\pm10°$), an electrode that is disposed on the $LiNbO_3$ substrate and that has an IDT electrode made mainly from Cu, a first silicon oxide film that is disposed in an area other than an area in which the electrode is disposed to have a thickness equal to that of the electrode, and a second silicon oxide film that is disposed so as to cover the electrode and the first silicon oxide film, wherein the surface acoustic wave device utilizes an SH wave, wherein a duty D of the IDT electrode is less than or equal to about 0.49, and $\theta$ of the Euler angles ($0°\pm5°$, $\theta\pm5°$, $0°\pm10°$) is set to fall within a range that satisfies the following inequality:

$$-10\times D+92.5-100\times C \leq \theta \leq 37.5\times D^2-57.75\times D+ 104.075+5710\times C^2-1105.7\times C+45.729$$

D: duty
C: thickness of the IDT electrode normalized using a wavelength $\lambda$.

2 Claims, 7 Drawing Sheets

SURFACE ACOUSTIC WAVE DEVICE

BACKGROUND OF THE INVENTION

1. Field of the Invention

The present invention relates to a surface acoustic wave device that is used, for example, as a resonator or a band-pass filter. More particularly, the present invention relates to a surface acoustic wave device that has a structure in which an IDT electrode and a silicon oxide film are disposed on a LiNbO$_3$ substrate and that utilizes an SH wave.

2. Description of the Related Art

A band-pass filter used in an RF stage of a cellular phone, or the like, is required to have a wide band and an outstanding temperature characteristic. Thus, the existing art employs a surface acoustic wave device in which an IDT electrode is disposed on a piezoelectric substrate made of a Y-rotated X-propagating LiTaO$_3$ substrate or a Y-rotated X propagating LiNbO$_3$ substrate and a silicon oxide film is disposed to cover the IDT electrode. The piezoelectric substrate of this type has a negative frequency-temperature coefficient. Thus, in order to improve the temperature characteristic, a silicon oxide film having a positive frequency-temperature characteristic is disposed so as to cover the IDT electrode.

However, when the IDT electrode is made of Al or an alloy that mostly contains Al, which are generally used, the IDT electrode has not been able to have a sufficient reflection coefficient. Thus, there has been a problem in which a ripple occurs in the resonance characteristic.

WO 2005-034347 describes a surface acoustic wave device that solves the above problem, a description of which follows. Here, an IDT electrode made of a metal having a density that is greater than that of Al is disposed on a piezoelectric substrate made of LiNbO$_3$ having an electromechanical coefficient K$^2$ of greater than or equal to 0.025, a first silicon oxide film is disposed in the area, other than the area in which the IDT electrode is disposed, so as to have a thickness equal to the electrode, and a second silicon oxide film is laminated so as to cover the electrode and the first silicon oxide film.

In the surface acoustic wave device described in WO 2005-034347, the density of the IDT electrode is greater than or equal to one and half times the density of the first silicon oxide film. Thus, the reflection coefficient of the IDT electrode is sufficiently increased to thereby make it possible to suppress a ripple that occurs in the resonance characteristic.

In addition, in WO 2005-034347, a Rayleigh wave is utilized and Au, Cu, or the like, is shown as the electrode material. The structure in which the electrode made of Cu has a thickness of 0.0058λ to 0.11λ is described. In this case, the LiNbO$_3$ substrate having Euler angles of (0°±5°, 62° to 167°, 0°±10°), preferably, (0°±5°, 88° to 117°, 0°±10°), is described, and the thickness of the second silicon oxide film ranges from 0.15λ to 0.4λ where λ is a wavelength of a surface wave.

In the surface acoustic wave device described in WO 2005-034347, when θ of the Euler angles of the LiNbO$_3$ substrate, the thickness of the electrode made of Cu and the thickness of the second silicon oxide film are set to fall within the above specific range, as described above, it is possible to increase the electromechanical coefficient K$_R^2$ when a Rayleigh wave is utilized, and it is possible to reduce the electromechanical coefficient of a mode that becomes a spurious response.

On the other hand, a duty of an IDT electrode is possibly reduced in the surface acoustic wave device in order to enhance power withstanding performance. The duty is a ratio of a size of an electrode finger in width direction to a sum of a size of the electrode finger in the width direction and a gap between the adjacent electrode fingers. In the surface acoustic wave device described in WO 2005-034347, the duty of the IDT electrode is not considered.

In the surface acoustic wave device described in WO 2005-034347, when the duty is reduced to a value less than 0.5 in order to enhance power withstanding performance, the power withstanding performance is enhanced, however, a large spurious response sometimes occurs. That is, even when the range of the thickness of an electrode film and the range of θ of Euler angles are selected as described in WO 2005-034347, if the duty is reduced in order to enhance power withstanding performance, a large spurious response sometimes occurs.

In addition, depending on conditions on which the surface acoustic wave device is manufactured, a spurious response sometimes occurs due to change in size of each electrode finger in the width direction by the conditions of manufacturing, or the like.

SUMMARY OF THE INVENTION

Preferred embodiments of the present invention eliminate the above described disadvantages in the existing art and provide a surface acoustic wave device including an IDT electrode that is mainly made of Cu and is disposed on an LiNbO$_3$ substrate, and that has a large electromechanical coefficient of a mode to be used and has a sufficiently small electromechanical coefficient of a mode that becomes a spurious response, even when a duty is reduced in order to enhance power withstanding performance.

A surface acoustic wave device according to a preferred embodiment of the present invention includes an LiNbO$_3$ substrate having Euler angles (0°±5°, θ±5°, 0°±10°), an electrode that is disposed on the LiNbO$_3$ substrate and that has an IDT electrode made mainly of Cu, a first silicon oxide film that is disposed in an area other than an area in which the electrode is disposed so as to have a thickness equal to that of the electrode, and a second silicon oxide film that is disposed to cover the electrode and the first silicon oxide film, wherein the surface acoustic wave device utilizes an SH wave, a duty D of the IDT electrode is less than or equal to about 0.49, and θ of the Euler angles (0°±5°, θ±5°, 0°±10°) is set to fall within a range that satisfies the following Inequality (1):

$$-10 \times D + 92.5 - 100 \times C \leq \theta \leq 37.5 \times D2 - 57.75 \times D + 104.075 + 5710 \times C2 - 1105.7 \times C + 45.729 \quad \text{Inequality (1)}$$

D: duty

C: thickness of the IDT electrode normalized using a wavelength λ

In a surface acoustic wave device according to a preferred embodiment of the present invention, more preferably, a thickness H of the second silicon oxide film preferably ranges from about 0.16λ to about 0.30λ, for example. As a result, it is possible to further reduce a response of a higher order mode of SH wave, which becomes a spurious response.

In a surface acoustic wave device according to a preferred embodiment of the present invention, the IDT electrode made mainly of Cu is disposed on the LiNbO$_3$ substrate, and then the first and second silicon oxide films are disposed. Thus, in the surface acoustic wave device that utilizes an SH wave, it is possible to reduce the absolute value of the frequency-temperature coefficient to thereby improve the temperature characteristic. Moreover, because the duty D of the IDT electrode preferably is less than or equal to about 0.49, power withstanding performance is effectively enhanced.

In addition, because θ of the Euler angles of the LiNbO$_3$ substrate is set to fall within the range of Inequality (1) in consideration of the duty D, it is possible to reduce the electromechanical coefficient $K_R^2$ of a Rayleigh wave that becomes a spurious response, and it is also possible to reduce the electromechanical coefficient of a higher order mode of SH wave. Thus, it is possible to obtain an outstanding resonance characteristic or filter characteristic in which an SH wave is utilized and a spurious response is suppressed.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, specific preferred embodiments of the present invention will be described with reference to the accompanying drawings to clarify the present invention.

Figure 1A:
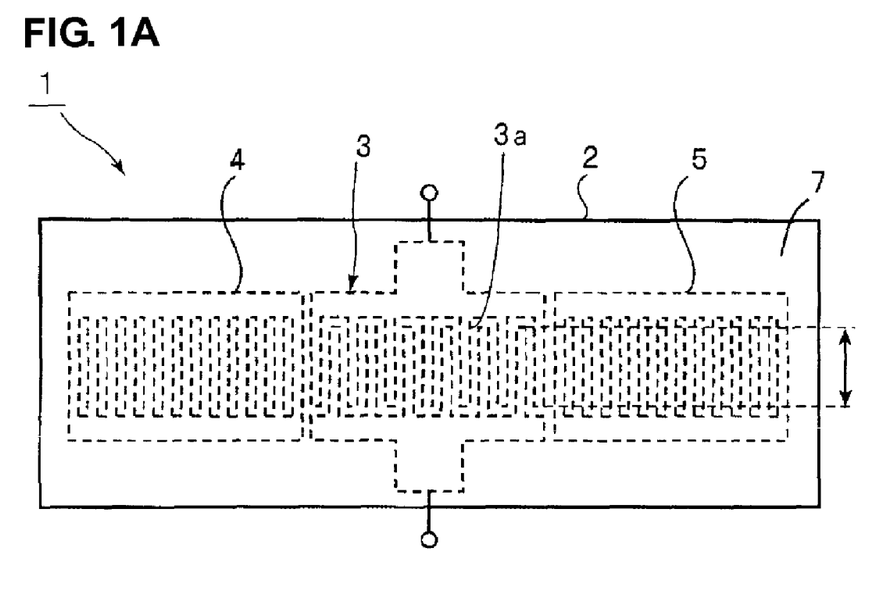
FIG. 1A is a schematic plan view of a surface acoustic wave device according to a preferred embodiment of the present invention.
Figure 1B:
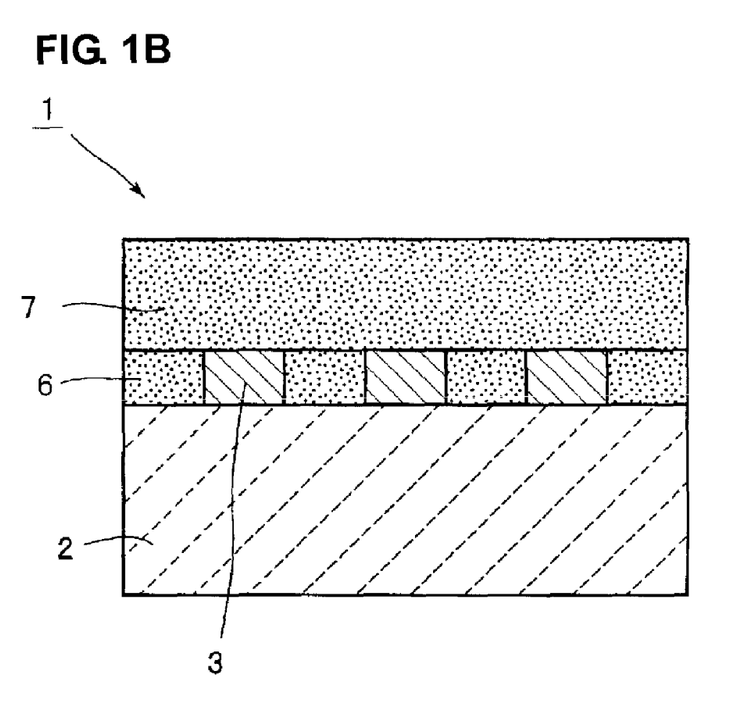
FIG. 1B is a partially enlarged front cross-sectional view that shows a relevant portion of the surface acoustic wave device.

FIG. 1A is a schematic plan view of a surface acoustic wave device according to a preferred embodiment of the invention, and FIG. 1B is a partially enlarged front cross-sectional view that shows a relevant portion of the surface acoustic wave device.

The surface acoustic wave device 1 is preferably disposed of a Y-rotated X-propagating LiNbO$_3$ substrate 2. The crystal orientation of the LiNbO$_3$ substrate 2 is preferably (0°±5°, θ, 0°±10°) in Euler angles.

In addition, an IDT electrode 3 is disposed on the LiNbO$_3$ substrate 2, as shown in FIG. 1B. As shown in FIG. 1A, reflectors 4 and 5 are disposed respectively on both sides of the IDT electrode 3 in a surface acoustic wave propagating direction in which a surface acoustic wave propagates.

In the remaining area other than these areas in which the electrode is disposed, a first silicon oxide film 6 is disposed. The thickness of the first silicon oxide film 6 is preferably set to be equal or substantially equal to the thickness of the IDT electrode 3 and the thickness of each of the reflectors 4 and 5. Then, a second silicon oxide film 7 is disposed to cover the electrodes 3 and 4 and the first silicon oxide film 6.

In the surface acoustic wave device 1, the LiNbO$_3$ substrate has a negative frequency-temperature coefficient. In contrast, the silicon oxide films 6 and 7 have a positive frequency-temperature coefficient. Thus, it is possible to improve the frequency characteristic.

In the present preferred embodiment, the IDT electrode 3 is preferably made of Cu and has a density of about 8.93 g/cm$^3$. On the other hand, the first silicon oxide film has a density of about 2.21 g/cm$^3$.

Thus, as described in the above WO 2005-034347, it is possible to increase the reflection coefficient of the IDT electrode 3. By so doing, it is possible to suppress a ripple that occurs in the resonance characteristic.

Figure 2:
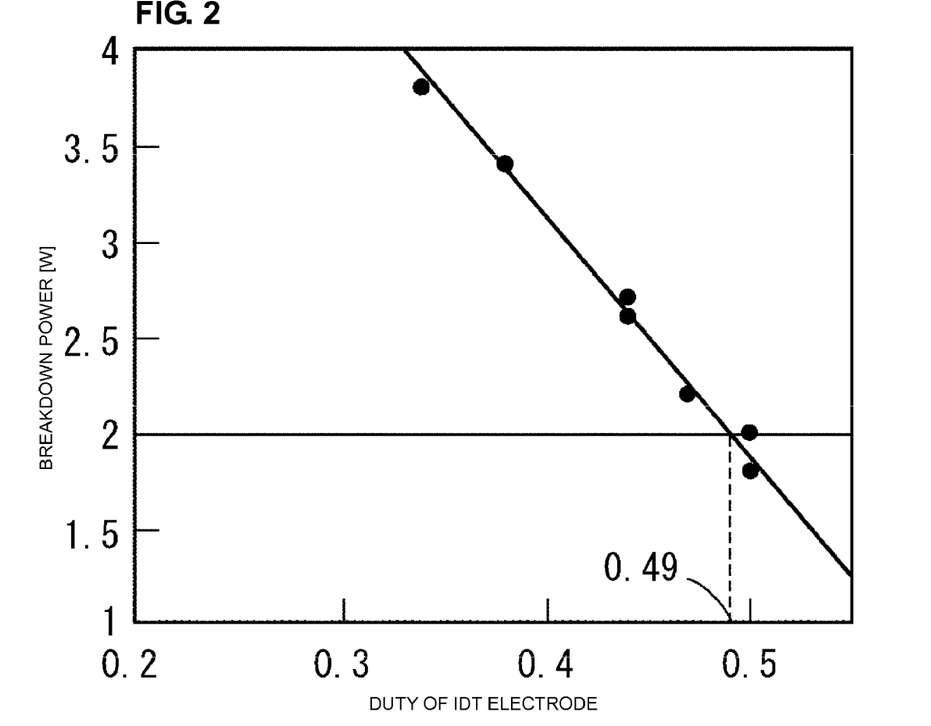
FIG. 2 is a view that shows a relationship between a duty of an IDT electrode and a breakdown power.

In the surface acoustic wave device 1, a variation in breakdown power when the duty of the IDT electrode is changed is shown in FIG. 2. In FIG. 2, it appears that as the duty decreases to a value less than about 0.5, the breakdown power increases. This is because the size of each gap between adjacent electrode fingers increases as compared with the width of each electrode finger. Then, it appears that when the duty of the IDT electrode is set to a value less than about 0.5, particularly, about 0.49 or below, the breakdown power increases to a value greater than or equal to about 2 W as an absolute value. A surface acoustic wave device used in a band-pass filter of a cellular phone is required to have a breakdown power of about 2 W or above. Thus, in a preferred embodiment of the present invention, the duty of the IDT electrode is preferably set to about 0.49 or below.

However, it has been found that when the duty is set to about 0.49 or below, that is, a value less than about 0.5, an undesirable spurious response occurs.

However, the above spurious response is suppressed in such a manner that θ of the Euler angles of the LiNbO$_3$ substrate is set to fall within a range that satisfies the following Inequality (1):

$$-10 \times D + 92.5 - 100 \times C \leq \theta \leq 37.5 \times D^2 - 57.75 \times D + 104.075 + 5710 \times C^2 - 1105.7 \times C + 45.729 \quad \text{Inequality (1)}$$

D: duty

C: thickness of the IDT electrode normalized using a wavelength λ

Hereinafter, the fact that a spurious response when an SH wave is used may be effectively suppressed in such a manner that θ of the Euler angles of the LiNbO$_3$ substrate is set to fall within the range that satisfies the above Inequality (1) will be further specifically described.

Figure 3:
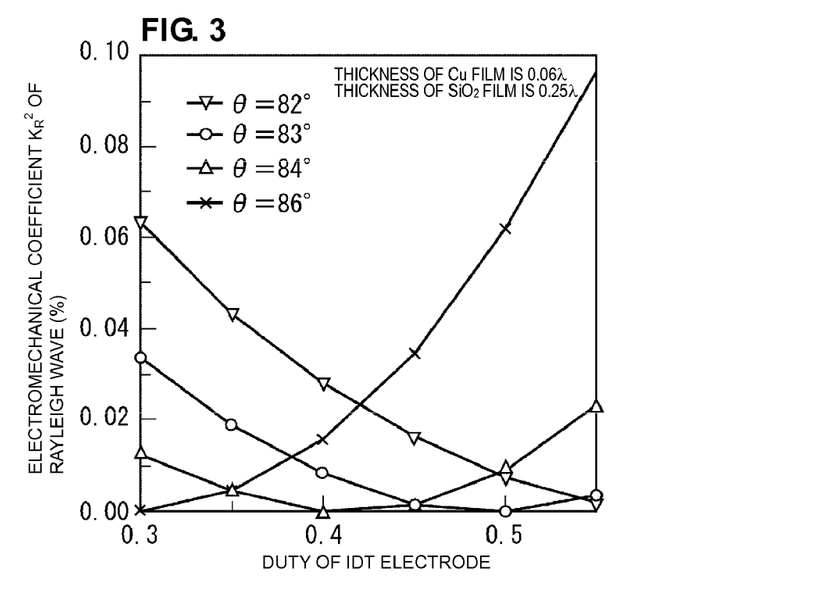
FIG. 3 is a view in which, when, on an LiNbO$_3$ substrate having Euler angles (0°, θ, 0°), an IDT electrode made of Cu having a thickness of about 0.06λ is disposed, first and second silicon oxide films are disposed, and the thickness of the second silicon oxide film is approximately 0.25λ, shows a relationship among θ of the Euler angles, a duty of the IDT electrode, and an electromechanical coefficient $K_R^2$ of a Rayleigh wave.

FIG. 3 is a view that, in a structure such that an IDT electrode made of Cu having a thickness of about 0.06λ is disposed on the LiNbO$_3$ substrate having about 82 degrees, about 83 degrees, about 84 degrees or about 86 degrees for θ of the Euler angles (0°, θ, 0°), an SiO$_2$ film made of Cu having the same thickness as that of the IDT electrode is disposed as a first silicon oxide film, and an SiO$_2$ film having a thickness of about 0.25λ is disposed as a second silicon oxide film so as to cover the IDT electrode and the first silicon oxide film, shows a relationship between a duty of the IDT electrode and an electromechanical coefficient $K_R^2$ of a Rayleigh wave that becomes a spurious response.

Figure 6:
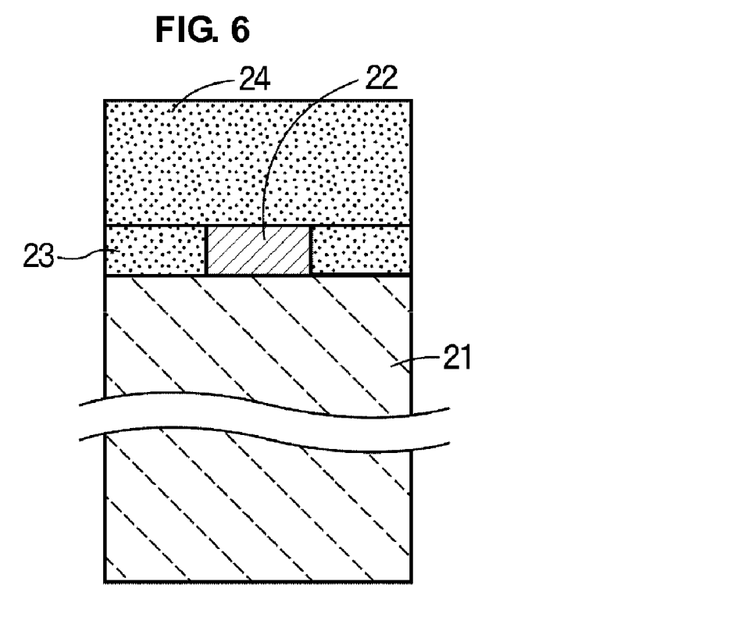
FIG. 6 is a schematic view that schematically shows a calculation model of a surface acoustic wave device that is assumed to obtain the results shown in FIG. 3 to FIG. 5.

Note that the results shown in FIG. 3, FIG. 4A, and FIG. 4B, and the like, which will be described later, are calculated through a finite element method on the basis of the calculation model shown in FIG. 6. As is apparent from FIG. 6, a structure that an IDT electrode 22 and a first silicon oxide film 23 are disposed on an LiNbO$_3$ substrate 21 having an infinite thickness, and a second silicon oxide film 24 is disposed thereon was employed as the model.

As is apparent from FIG. 3, when θ=82°, and the duty is about 0.5, the electromechanical coefficient $K_R^2$ of a Rayleigh wave is less than or equal to about 0.04%. However, as the duty decreases from approximately 0.5, the electromechanical coefficient $K_R^2$ of a Rayleigh wave increases and, therefore, it appears that a spurious response due to the Rayleigh wave cannot be ignored. Thus, it appears that from FIG. 3, when the duty is less than about 0.5, it is necessary to adjust θ of the Euler angles.

Figure 4A:
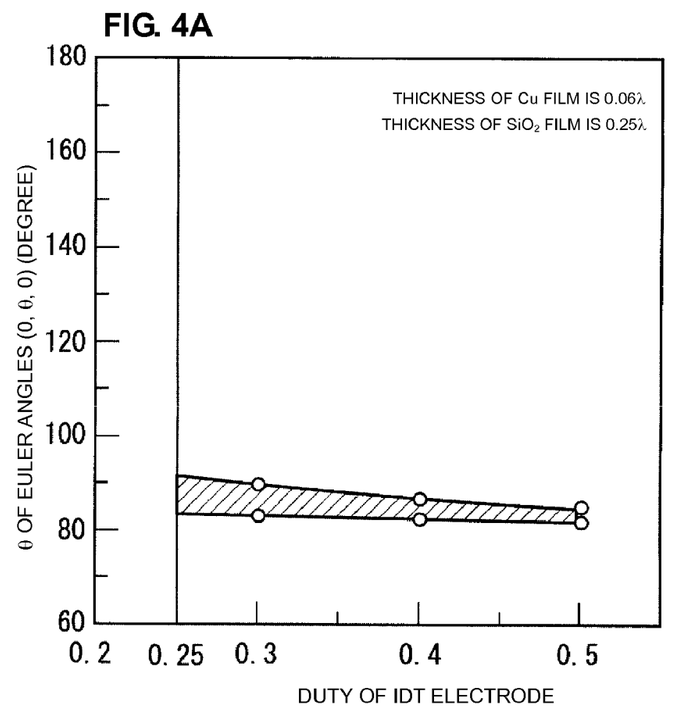
FIG. 4A is a view in which, in a surface acoustic wave device that is disposed so that, on an LiNbO$_3$ substrate having Euler angles (0°, θ, 0°), an IDT electrode made of Cu having a thickness of about 0.06λ is disposed, first and second silicon oxide films are disposed, and the thickness of the second silicon oxide film is about 0.25λ, shows a relationship between θ of the Euler angles and the duty when the electromechanical coefficient $K_R^2$ of a Rayleigh wave that becomes a spurious response is about 0.04% or below.

FIG. 4A is a view that shows an area in which the electromechanical coefficient $K_R^2$ of a Rayleigh wave is about 0.04% or below in a structure in which, on an LiNbO$_3$ substrate having Euler angles (0°, θ, 0°), as in a similar manner, an IDT electrode made of a Cu film having a thickness of about 0.06λ is disposed, an SiO$_2$ film having the same thickness is disposed and then an SiO$_2$ film having a thickness of about 0.25λ is disposed. The area hatched with oblique lines in FIG. 4A is the area in which the electromechanical coefficient $K_R^2$ of a Rayleigh wave is about 0.04% or below. In addition, the line at a duty of about 0.25, extending vertically in FIG. 4A, shows a lower limit of the duty. When the duty is less than or equal to the lower limit, it is difficult to manufacture the IDT electrode of the surface acoustic wave device.

Thus, from FIG. 4A, when the duty is greater than or equal to about 0.25 and less than or equal to about 0.49, and θ of the Euler angles in the area hatched in FIG. 4A is selected, it is possible to reduce the electromechanical coefficient $K_R^2$ of a Rayleigh wave that becomes a spurious response to about 0.04% or below. When the area hatched by oblique lines in FIG. 4A is expressed in Inequality, a value will be expressed by Inequality (2):

$$-10 \times D + 86.5 \leq \theta \leq 37.5 \times D^2 - 57.75 \times D + 104.075 \quad \text{Inequality (2)}$$

D: duty

The thickness of the IDT electrode preferably is about 0.06λ.

Inequality (2) is a relationship that is established when the thickness of the IDT electrode made of Cu is about 0.06λ. Then, θ and duty, at which the electromechanical coefficient $K_R^2$ of a Rayleigh wave is small, change depending on the thickness of the IDT electrode made of Cu. Then, in the structure such that the thickness of the SiO$_2$ film is about 0.25λ and the duty is about 0.40, θ that makes the electromechanical coefficient $K_R^2$ of a Rayleigh wave be about 0.04% or below was obtained when the thickness of the IDT electrode made of Cu was changed The results are shown in FIG. 4B.

Figure 4B:
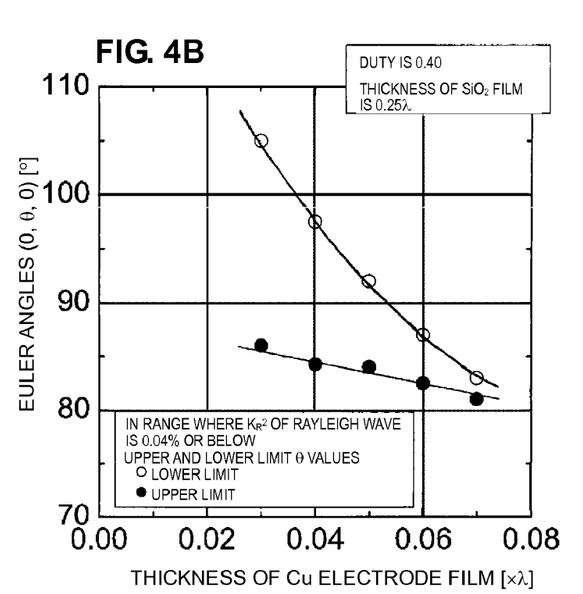
FIG. 4B is a view in which, in a surface acoustic wave device that is disposed so that, on an LiNbO$_3$ substrate having Euler angles (0°, θ, 0°), an IDT electrode made of Cu is disposed, first and second silicon oxide films are disposed, the thickness of the second silicon oxide film is about 0.25λ, and the duty of the IDT electrode is about 0.40, shows a relationship between θ of the Euler angles and a thickness of a Cu electrode, which is the IDT electrode, when the electromechanical coefficient $K_R^2$ of a Rayleigh wave that becomes a spurious response is about 0.04% or below.

As shown in FIG. 4B, an area in which the electromechanical coefficient $K_R^2$ of a Rayleigh wave is about 0.04% or below depends on the thickness of the IDT electrode made of Cu. Thus, in consideration of dependency on the thickness of the electrode, Inequality (2) may be expressed similar to the case of Inequality (1).

Note that the relationship of Inequality (1) does not change noticeably within the range in which the thickness of the second silicon oxide film is about 0.15λ to about 0.4λ. This will be described with reference to FIG. 5.

Figure 5:
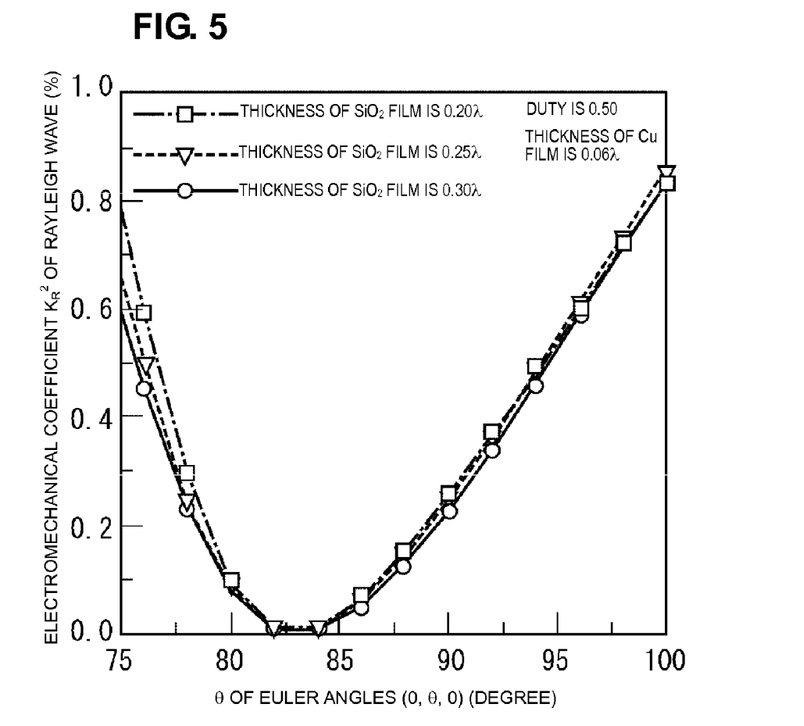
FIG. 5 is a view that, in a structure such that, on an LiNbO$_3$ substrate having Euler angles (0°, θ, 0°), an IDT electrode made of Cu having a thickness of about 0.06λ and a duty of about 0.50 is disposed, shows a relationship among a thickness of the second silicon oxide film, θ of the Euler angles, and an electromechanical coefficient $K_R^2$ of a Rayleigh wave.

FIG. 5 is a view in which, in a structure with an LiNbO$_3$ substrate having Euler angles (0°, θ, 0°), and an IDT electrode made of Cu having a thickness of about 0.06λ is disposed to have a duty of about 0.50, shows a relationship between θ of the Euler angles and an electromechanical coefficient $K_R^2$ of a Rayleigh wave when the thickness of the second silicon oxide film is set to about 0.20λ, about 0.25λ, or about 0.30λ. As is apparent from FIG. 5, it appears that even when the thickness of the SiO$_2$ is changed within the range of about 0.20λ to about 0.30λ, a relationship between θ of the Euler angles and an electromechanical coefficient $K_R^2$ of a Rayleigh wave does not change much. It was confirmed through experiment that even when the thickness of the SiO$_2$ film is changed within the range of about 0.15λ to about 0.40λ, similarly to the results shown in FIG. 5, the relationship between the electromechanical coefficient $K_R^2$ of a Rayleigh wave and θ does not substantially change.

Note that in a preferred embodiment of the present invention, preferably, the thickness of the IDT electrode is preferably set to fall within the range of about 0.03λ to about 0.072λ, for example. That is, according to the above described Inequality (1), when the thickness of Cu is around 0.072λ, the upper limit and lower limit of θ are inverted. That is, as the value of about 0.072λ is exceeded, there is no range in which the electromechanical coefficient $K_R^2$ of a Rayleigh wave is about 0.04% or below. Thus, the thickness of the IDT electrode is preferably about 0.072λ or below.

In addition, when a spurious response of a Rayleigh wave is considered, as the thickness of the IDT electrode is reduced, the range in which the electromechanical coefficient $K_R^2$ of a Rayleigh wave is small expands. Thus, it is more preferable that the thickness of the IDT electrode is reduced. However, if the thickness of the IDT electrode is too small, the acoustic velocity of a surface acoustic wave becomes higher than the acoustic velocity of a slow transverse wave. Thus, attenuation may possibly increase. In consideration of the above point, the thickness of the IDT electrode is desirably about 0.03λ or above. Thus, the thickness of the IDT electrode made mainly from Cu desirably ranges from about 0.03λ to about 0.072λ, for example.

Next, an example of a preferred embodiment in which a surface acoustic wave device was actually manufactured on the basis of the above-described preferred embodiment will be described.

A Y-rotated X-propagating LiNbO$_3$ substrate having Euler angles (0°, 82° to 86°, 0°) was prepared. A SiO$_2$ film was deposited on the LiNbO$_3$ substrate as a first silicon oxide film so as to have a thickness of about 107 nm (about 0.057λ). After that, a resist pattern was disposed on the SiO$_2$ film, and then the SiO$_2$ film was selectively etched through reactive ion etching (RIE) using the resist pattern to thereby form a groove. A Cu film was deposited so as to fill the groove with Cu to thereby form an IDT electrode. After that, the Cu film other than the IDT electrode was removed together with the resist pattern through lift-off method, and then a SiO$_2$ film having a thickness of about 460 nm (about 0.24λ) was deposited as a second silicon oxide film.

In this way, a one-port surface acoustic wave resonator having λ=1.89 μm, that is, a resonance frequency of 1.9 GHz band, was manufactured.

Figure 7:
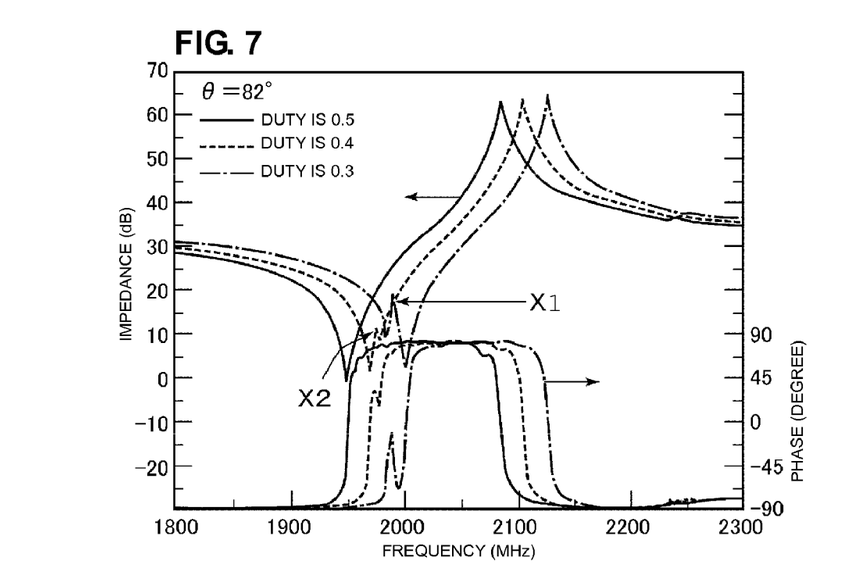
FIG. 7 is a view that shows the impedance-frequency characteristics and phase-frequency characteristics of a plurality of types of surface acoustic wave devices that are disposed so that an IDT electrode having a duty of about 0.3, about 0.4 or about 0.5 is disposed on a LiNbO$_3$ substrate having approximately 82° for θ of the Euler angles.
Figure 8:
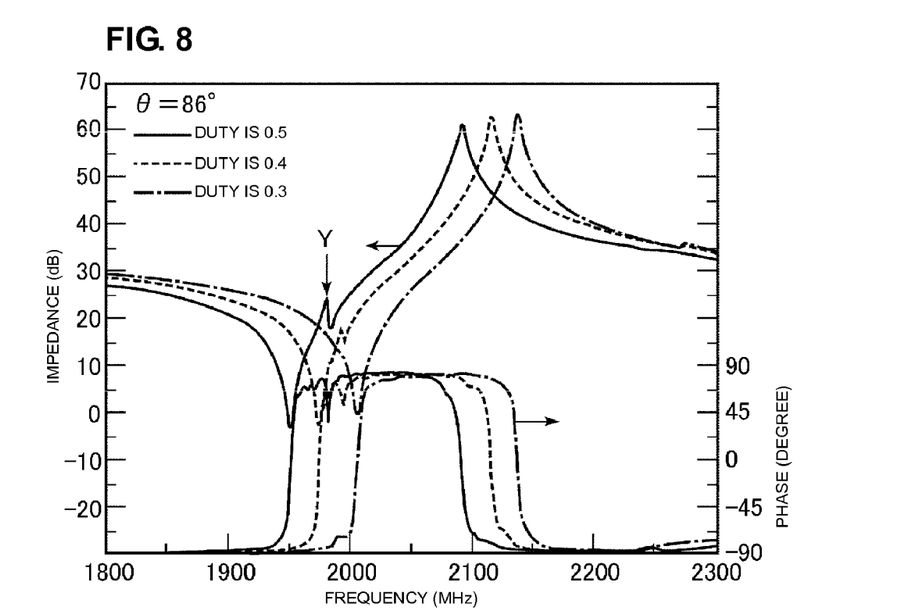
FIG. 8 is a view that shows the impedance-frequency characteristics and phase-frequency characteristics of a plurality of types of surface acoustic wave devices that are disposed so that an IDT electrode having a duty of about 0.3, about 0.4 or about 0.5 is disposed on a LiNbO$_3$ substrate having approximately 86° for θ of the Euler angles.

FIG. 7 and FIG. 8 show the impedance-frequency characteristic and phase-frequency characteristic of the one-port surface acoustic wave resonator obtained in the above described manner. FIG. 7 shows the results when θ of the Euler angles is 82° and the duty of the IDT electrode is about 0.3, about 0.4 or about 0.5. FIG. 8 shows the characteristic when θ of the Euler angles is about 86° and the duty is about 0.3, about 0.4 or about 0.5.

As is apparent from FIG. 7, it appears that, when θ of the Euler angles is about 82°, a spurious response, which is not present when the duty is about 0.5, occurs noticeably as indicated by arrows X1 and X2 as the duty decreases to about 0.4 or about 0.3.

In contrast, as is apparent from FIG. 8, it appears that when θ of the Euler angles is about 86°, a spurious response, which occurs at a duty of about 0.5 indicated by arrow Y, decreases as the duty decreases. In this case, the range in which θ is about 86° and the duty is about 0.3 satisfies the above described Inequality (1). The other range does not satisfy the above described Inequality (1), that is, an example outside the scope of the present invention.

Thus, as is apparent from the results shown in FIG. 7 and FIG. 8, it appears that when θ of the Euler angles is set to satisfy the above described Inequality (1) in consideration of the duty D, an undesirable spurious response when an SH wave is utilized may be effectively suppressed.

Note that the IDT electrode, as long as it made mainly from Cu, may be disposed so that an adhesive layer, as a foundation film, is laminated at the lower side of an electrode layer made of Cu or a protective layer is laminated on the upper surface of a main electrode layer. Furthermore, the main electrode layer need not be made of simple Cu, and it may be made of an alloy that mostly contains Cu. In addition, a secondary metal film made of a metal other than Cu may be laminated on an electrode film made of Cu or an ally that mostly contains Cu.

Next, as in a similar manner to the above preferred embodiment, a duplexer DPX for WCDMA was manufactured. Here, a transmission-side band-pass filter of the duplexer DPX was manufactured from a surface acoustic wave filter that uses a plurality of surface acoustic wave resonators defined in accordance with a preferred embodiment of the present invention. More specifically, an IDT electrode made of Cu was disposed on an LiNbO$_3$ substrate having Euler angles (0°, 84°, 0°) so that the thickness is about 108 nm (about 0.057λ) and the duty is about 0.40. Note that a SiO$_2$ film having a thickness equal to that of the IDT electrode was deposited as a first silicon oxide film, and a SiO$_2$ film having a thickness of about 159 nm (about 0.24λ) was disposed so as to cover the IDT electrode and the first silicon oxide film. Here, a SiN film was deposited on the uppermost portion in order to adjust frequency, and the SiN film was etched to adjust the frequency. The thickness of the SiN film after frequency adjustment is about 15 nm.

Note that the frequency adjustment film may employ a SiC film, a Si film, or the like, other than the SiN film.

Figure 9:
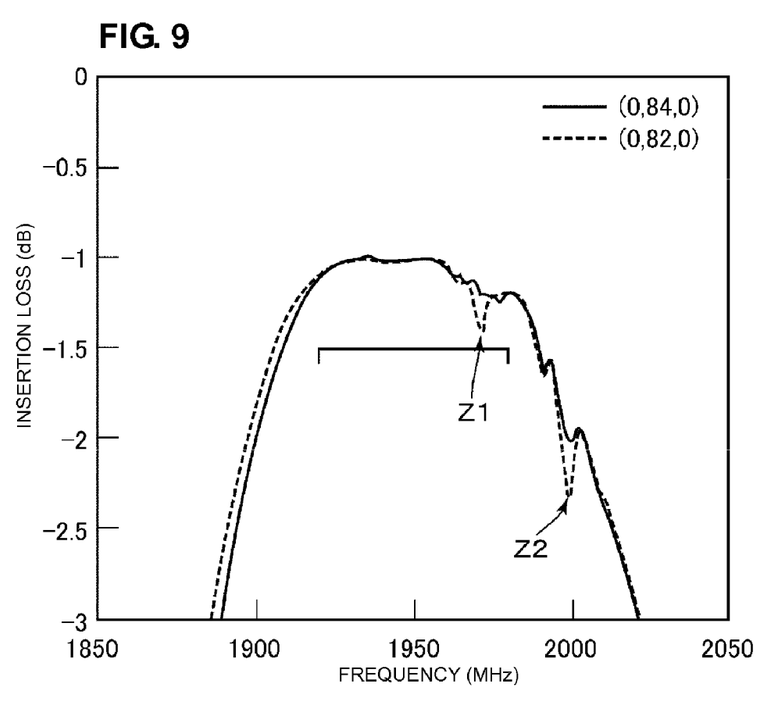
FIG. 9 is a view that shows the filter characteristic of a surface acoustic wave filter having Euler angles (0°, 84°, 0°) according to a preferred embodiment of the present invention and the filter characteristic of a surface acoustic wave filter that uses an LiNbO$_3$ substrate having Euler angles (0°, 82°, 0°) according to a second preferred embodiment of the present invention.

FIG. 9 is a view that shows the filter characteristic of the surface acoustic wave filter for DPX, obtained as described above. For comparison, FIG. 9 shows, by the broken line, the filter characteristic of a surface acoustic wave filter for a duplexer, which is defined similarly to the above except that the Euler angles are set to (0°, 82°, 0°). Note that the IDT electrode made of Cu having the characteristic indicated by the solid line, that is, Euler angles (0°, 84°, 0°), and the above thickness and thickness satisfies Inequality (1), while on the other hand, the filter characteristic indicated by the broken line does not satisfy the relationship expressed by Inequality (1). As is apparent from FIG. 9, in the comparative example indicated by the broken line, large spurious responses indicated by the arrows Z1 and Z2 appear. These are spurious responses due to a Rayleigh wave. In contrast, in a second preferred embodiment, it appears that such spurious responses are sufficiently suppressed and, therefore, an outstanding filter characteristic may be obtained.

Figure 10:
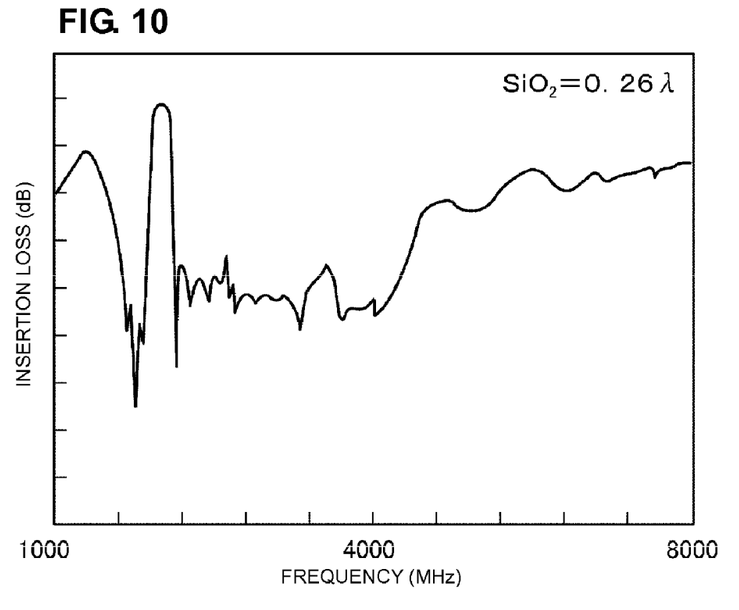
FIG. 10 is a view that shows the frequency characteristic of a pass band and a band higher than the pass band of a surface acoustic wave filter according to the second preferred embodiment shown in FIG. 9.

Next, FIG. 10 shows the frequency characteristic of a pass band and a band higher than the pass band of a surface acoustic wave filter of the duplexer TPX manufactured in the second preferred embodiment.

Figure 11:
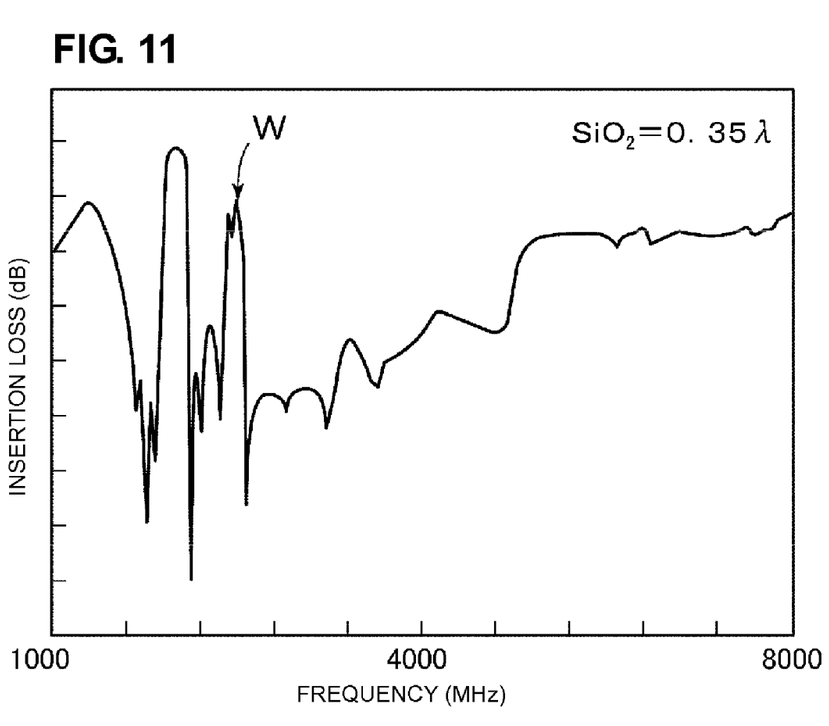
FIG. 11 is a view that shows the frequency characteristic of a pass band and a band higher than the pass band of a surface acoustic wave filter device according to a third preferred embodiment of the present invention, which is defined similarly to that of the second preferred embodiment except that the thickness of an SiO$_2$ film, which serves as a second silicon oxide film, is changed to about 0.35λ.

In addition, for comparison, FIG. 11 shows the frequency characteristic of a surface acoustic wave filter, which is defined similarly to the second preferred embodiment except that the thickness of the second silicon oxide film is changed to about 0.35λ.

In FIG. 11, as indicated by the arrow W, a spurious response due to a higher order mode of SH wave occurs. That is, it appears that a spurious response that is presumably due to a higher order mode of SH wave remarkably depends on the thickness of the SiO$_2$ film, which serves as a second silicon oxide film. Then, in terms of filter characteristic, when the thickness of the second silicon oxide film is preferably set to about 0.03λ or below, it is possible to effectively suppress a spurious response due to a higher order mode of SH wave indicated by the arrow W in FIG. 11.

The Euler angles of the LiNbO$_3$ substrate are preferably set to (0°, θ±5°, 0°) in the present preferred embodiment. However, as confirmed by experiment, in the Euler angles (φ, θ, ψ), φ only needs to be within the range of about 0°±5°, and ψ needs to be within the range of about 0°±10°. In either case, it has been confirmed that advantages similar to those of the above described preferred embodiment may be obtained.

Furthermore, the present invention is not limited to the above described one-port surface acoustic wave resonator or the band-pass filter portion of the duplexer. It may be applied to various resonators or surface acoustic wave filters of various circuit configurations.

While the present invention has been described with respect to preferred embodiments thereof, it will be apparent to those skilled in the art that the disclosed invention may be modified in numerous ways and may assume many embodiments other than those specifically set out and described above. Accordingly, the appended claims are intended to cover all modifications of the present invention that fall within the true spirit and scope of the present invention.

What is claimed is:

1. A surface acoustic wave device comprising:

an $LiNbO_3$ substrate having Euler angles of approximately 0°±5°, θ±5°, and 0°±10°;

an electrode that is disposed on the $LiNbO_3$ substrate and that has an IDT electrode mainly made of Cu;

a first silicon oxide film that is disposed in an area other than an area in which the electrode is disposed to have a thickness substantially equal to that of the electrode; and a second silicon oxide film that is disposed to cover the electrode and the first silicon oxide film; wherein the surface acoustic wave device utilizes an SH wave, wherein a duty D of the IDT electrode is less than or equal to about 0.49, and θ of the Euler angles is set so as to fall within a range that satisfies the following inequality:

$$-10 \times D + 92.5 - 100 \times C \leq \theta \leq 37.5 \times D^2 - 57.75 \times D + 104.075 + 5710 \times C^2 - 1105.7 \times C + 45.729$$

D: duty
C: thickness of the IDT electrode normalized using a wavelength λ.

2. The surface acoustic wave device according to claim 1, wherein a thickness H of the second silicon oxide film ranges from about 0.16λ to about 0.30λ.

* * * * *